(12) United States Patent
Chiou et al.

(10) Patent No.: US 8,143,513 B2
(45) Date of Patent: Mar. 27, 2012

(54) SOLAR CELL WITH SUPERLATTICE STRUCTURE AND FABRICATING METHOD THEREOF

(75) Inventors: Chih-Hung Chiou, Hsinchu (TW);
Pei-Hsuan Wu, Hsinchu (TW);
Shang-Fu Chen, Hsinchu (TW);
I-Liang Chen, Hsinchu (TW);
Jung-Tsung Hsu, Hsinchu (TW);
Andrew-Yen C. Tzeng, Taoyuan (TW);
Chih-Hung Wu, Taoyuan (TW)

(73) Assignees: Industrial Technology Research Institute, Hsinchu (TW); Atomic Energy Council—Institute of Nuclear Energy Research, Taoyuan (TW)

( * ) Notice: Subject to any disclaimer, the term of this patent is extended or adjusted under 35 U.S.C. 154(b) by 813 days.

(21) Appl. No.: 11/476,091

(22) Filed: Jun. 28, 2006

(65) Prior Publication Data

US 2007/0151595 A1 Jul. 5, 2007

(30) Foreign Application Priority Data

Dec. 30, 2005 (TW) ................ 94147747 A

(51) Int. Cl.
*H01L 31/00* (2006.01)
*H01L 21/00* (2006.01)
(52) U.S. Cl. .......................... 136/255; 438/73
(58) Field of Classification Search .......... 136/243, 136/249, 252, 255, 261, 262; 257/104, 183, 257/184, 200, 461; 438/73
See application file for complete search history.

(56) References Cited

U.S. PATENT DOCUMENTS

| | | | |
|---|---|---|---|
| 3,993,506 A | 11/1976 | Moon | |
| 4,128,733 A | 12/1978 | Fraas et al. | |
| 4,404,421 A | 9/1983 | Fraas | |
| 4,451,691 A | 5/1984 | Fraas | |
| 4,688,068 A | 8/1987 | Chaffin et al. | |
| 5,944,913 A | 8/1999 | Hou et al. | |
| 6,147,296 A | 11/2000 | Freundlich | |
| 6,281,426 B1 | 8/2001 | Olson et al. | |
| 6,372,980 B1 | 4/2002 | Freundlich | |
| 6,437,233 B1 | 8/2002 | Tran et al. | |
| 2004/0079408 A1* | 4/2004 | Fetzer et al. | 136/262 |
| 2007/0137695 A1* | 6/2007 | Fetzer et al. | 136/255 |

OTHER PUBLICATIONS

Legally, Max et al., "Silicon superlattices: New waves in thermoelectricity", Apr. 1, 2009, PHYSorg.com.*
Dimroth, F. et al., "MOVPE Grown Ga1-xInxAs Solar Cells for GaInP/GaInAs Tandem Applications", 2000, Journal of Electronic Materials, vol. 29, No. 1, pp. 42-46.*
Bhat, R. et al., "Growth of GaAsN/GaAs, GaInAsN/GaAs and GaInAsN/GaAs quantum wells by low-pressure organometallic chemical vapor deposition", 1998, Journal of Crystal Growth, 195, pp. 427-437.*
Pearton, Stephen J., "vol. 2—GaN and Related Materials", 1997, OPA, pp. 221 and 228.*

* cited by examiner

*Primary Examiner* — Basia Ridley
*Assistant Examiner* — Tamir Ayad
(74) *Attorney, Agent, or Firm* — Rabin & Berdo, P.C.

(57) ABSTRACT

A solar cell with a superlattice structure and a fabricating method thereof are provided, which includes fabricating a superlattice structure of GaAsN/GaInAs, GaAsN/GaSbAs, or GaAsN/GaInSbAs between a base and an emitter of a middle cell of a triple junction solar cell by a strain-compensation technology. The provided solar cell not only decreases crystalline defects and increases the critical thickness of the crystal, but also makes the energy bandgap of GaAsN and GaInAs reach around the energy of 1.0 eV (electron volt). Hence, the absorption region can be raised to around the energy of 1.0 eV to enhance the efficiency of the solar cell.

22 Claims, 2 Drawing Sheets

SOLAR CELL WITH SUPERLATTICE STRUCTURE AND FABRICATING METHOD THEREOF

CROSS-REFERENCE TO RELATED APPLICATIONS

This non-provisional application claims priority under 35 U.S.C. § 119(a) on Patent Application Ser. Nos. 094147747 filed in Taiwan, R.O.C. on Dec. 30, 2005, the entire contents of which are hereby incorporated by reference.

BACKGROUND OF THE INVENTION

1. Field of Invention

The present invention relates to a solar cell, and more particularly, to a solar cell with a superlattice structure and a fabricating method thereof.

2. Related Art

At present, the commercial solar cells according to the materials can be classified into the silicon and the III-V compound semiconductor solar cells. For a silicon-based solar cell, since silicon material is an indirect energy bandgap material, the light absorption of the silicon solar cell is poor and the energy conversion efficiency of the silicon-based solar cell is low, at most 24% or so at present. For a III-V compound semiconductor solar cell, since. the III-V group compound material has a direct energy bandgap, the Ill-V group compound semiconductor has advantages such as high energy conversion efficiency and strong anti-radiation ability, and it can work under high temperature and can be suitable for thin film growth. The quality of the III-V group compound semiconductor solar cells is superior to that of the silicon semiconductor solar cells. Therefore, many research reports indicate that the III-V group compound semiconductor material is more applicable to the development of high-performance solar cells.

As for a conventional III-V compound solar cell, in the fabricating process, common substrates for an epitaxy process are classified into GaAs substrates and Ge substrates. Since the lattice constant of the Ge substrate is approximately equal to that of GaAs, the Ge substrate can preferably match with various typical III-V compound materials, and can be fabricated a junction around 0.67eV. Thus the light with long-wavelength can be absorbed by the III-V group materials and the efficiency of the III-V group compound semiconductor solar cell is also improved. Therefore, the Ge is used as a common substrate in the market.

According to the structure, III-V group compound solar cells are classified into single-junction and multi-junction solar cells. The single-junction solar cell only absorbs the light of spectral region above single energy bandgap and the theoretical value of the conversion efficiency is 26-29% at most, and this is the main reason for the efficiency of the silicon-based solar cell cannot be further enhanced. Multi-junction solar cells, on the other hand, are usually made by a stack of semiconductors with different energy bandgap, to induce the spectral response covering the different energy regions of the solar spectrum, such as ultraviolet light, visible light, and infrared light. Therefore, the conversion efficiency of the multi-junction solar cell can be enhanced. The theoretical value of the conversion efficiency of a well-designed multi-junction solar cell can reach more than 50%.

As a result, the structures of components of solar cells are also gradually progressing. Firstly, the single-junction structure has been replaced by a multi-junction structure and the number of junctions has gradually increased. In recent years, a quantum well structure has appeared and gradually replaced the bulk structure, and thus a solar cell with high efficiency has been obtained. The structure of III-V compound solar cells and the fabricating method thereof have been claimed in many patents, such as U.S. Pat. Nos. 4,404,421, 4,128,733, 4,451,691, 5,944,913, 6,281,426, 6,372,980, 3,993,506, and 6,437,233.

At present, scores of different materials can be used to stack multi-junction solar cells. However, this does not mean that any materials can be stacked together due to lattice matching. When the difference among lattice constants of stacked materials is large, the strain will generate and to degrade the crystal quality. That will lead to a crystalline defect, and further decrease the conversion efficiency of the solar cell. The most efficient multi-junction solar cell in commerce to present is composed of three junctions, GaInP(1.85 eV)/GaAs(1.40 eV)/Ge(0.67 eV), i.e., a GaInP/GaAs/Ge triple junction solar cell. In theory, it can have a conversion efficiency of 40%. In the structure of the conventional triple junction solar cell, if the content of In of GaAs is added optionally to form a GaInAs compound, the energy bandgap thereof will be adjusted downward to the midst (1.26 eV) between 1.85eV and 0.67eV, so as to optimize the overall efficiency of the components. However, in fact, in order to decrease the difference between the lattice constants of the middle layer and the Ge substrate, the In content must be limited to within 1% so as to the energy bandgap cannot achieve 1.25 eV, and relatively the absorption of the infrared region is reduced. Thus, the efficiency of conventional triple junction solar cell cannot be optimized. In order to further enhance the efficiency, the U.S. Sandia National Laboratory recently provided a GaInP(1.85 eV)/GaAs(1.40 eV)/InGaNAs(1.0 eV)/Ge(0.67 eV) four-junction cell, i.e., InGaNAs is added between the GaAs junction and the Ge junction. Since the energy bandgap of InGaNAs can be controlled to be within 1.0 eV, the loss of absorption between 1.40 eV and 0.67 eV is compensated. Theoretically, the conversion efficiency can be greatly improved to more than 40%. However, in practice, since the quality of the InGaNAs material is rapidly deteriorated with the increase of the content of N, such that the carrier lifetime becomes shorter. Therefore, it is very difficult to obtain an InGaNAs (1.0eV) epitaxy material with high quality, such that the structure still cannot be brought into practice at present.

However, many III-V semiconductor materials have lattice constants matching with GaAs and Ge, such as AlGaAs, GaInAs, GaInAsN, GaInP, and GaAsN, but each kind of those materials must be carefully prepared to stack because not all arbitrary combinations can completely match. Therefore, the application region is small and the selection of materials for epitaxy growth is limited.

Furthermore, because it is difficult to match the lattices of conventional materials, stain is easily generated among the layers in the solar cell structure, such that a thicker epitaxy film cannot obtain, and the absorption region in the solar cell structure is limited, and further the efficiency of the solar cell is often negatively affected.

In recent years, the InGaNAs material is often used as an absorption material of 1.0 eV. But the crystal quality of the material is poor, resulting in disadvantages such as shorter carrier diffusion length, lower mobility, shorter lifetime, and higher impurities concentration. As a result, the efficiency of the whole solar cell cannot be enhanced efficiently.

In U.S. Pat. Nos. 4,688,068, 6,147,296, and 6,372,980, though quantum wells used in the multi-junction structure is claimed, the strain in the quantum well still cannot be completely compensated, such that the critical thickness in the crystal growing is thin or lattice defects are easily generated by the mismatching of lattices, which both negatively affect the conversion efficiency of the solar cell finally.

SUMMARY OF THE INVENTION

In view of the above problems, the main object of the present invention is to provide a solar cell with a superlattice structure and a fabricating method thereof, in order to solve the problems existing in the prior art, such as lattice defects or strains generated by the poor quality of the lattice mismatching, and thicker epitaxy film, which negatively affects the conversion efficiency of the solar cell.

In order to solve the aforementioned problems, a solar cell with a superlattice structure and a fabricating method thereof provided by the present invention include fabricating a superlattice structure between the base and the emitter of the middle cell in the triple junction solar cell formed of the III-V compound semiconductor by a strain-compensation technology.

The method for fabricating a solar cell with a superlattice structure provided by the present invention includes providing a substrate first; after forming a bottom cell on the substrate, forming a tunnel junction on the bottom cell; then forming a back surface field, a base, a superlattice structure, an emitter, and a window on the tunnel junction, so as to form a middle cell with the superlattice structure; then, forming another tunnel junction on the middle cell; forming a top cell on the other tunnel junction; forming an anti-reflection on the top cell; and forming p/n doped contacts respectively on the bottom cell and the top cell.

In comparison with the prior, the present invention has preferable quality and advantages, such as high carrier mobility, long diffusion length, low trap density, and high efficiency of spectral response, so as to efficiently increase the growth critical thickness after crystallization.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, and which thus is not limitative of the present invention, and wherein.

DETAILED DESCRIPTION OF THE INVENTION

Specific embodiments will be provided to illustrate the content of the present invention in detail with reference to drawings. The symbols mentioned in the specification correspond to the symbols in the figures.

The present invention provides a solar cell with a superlattice structure, which includes a superlattice structure between the base and the emitter of the middle cell of the triple junction solar cell.

The aforementioned superlattice structure is, for example, a GaAsN/GaInAs superlattice structure, a GaAsN/GaSbAs superlattice structure, or a GaAsN/GaInSbAs superlattice structure.

When the aforementioned triple junction solar cell is, for example, a GaInP/GaAs/Ge, an AlGaAs/GaAs/Ge, an AlGaInP/GaAs/Ge, a GaInP/GaInAs/Ge, an AlGaAs/GaInAs/Ge, or an AlGaInP/GaInAs/Ge triple junction solar cell, the middle cell is a GaAs or a GaInAs middle cell. The base of the middle cell is a p-type or n-type GaAs, or a p-type or n-type GaInAs. The emitter is a p-type or n-type GaAs, or a p-type or n-type GaInAs, with an electrical property opposite that of the base.

The principles utilized by the present invention are described as follows.

Figure 1:
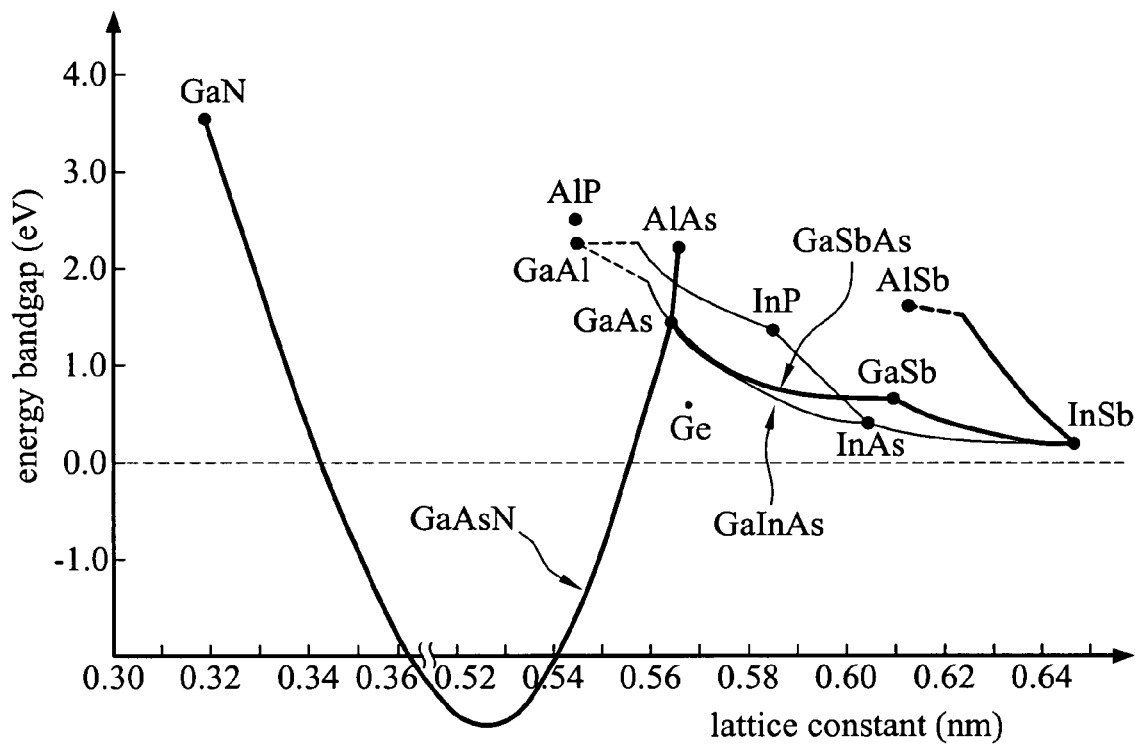
FIG. 1 is a lattice constant-energy bandgap view of the III-V compound semiconductor according to an embodiment of the present invention.

FIG. 1 is a lattice constant-energy bandgap view of the III-V compound semiconductor according to one embodiment of the present invention. As shown in FIG. 1, if the absorption effect of long-wavelength between 1.4 eV and 0.7 eV needs to be enhanced and the lattice constant is approximate to that of Ge, materials that can be selected include GaAsN, GaInAs, and GaSbAs, in addition to InGaNAs. If GaAsN, GaInAs, or GaSbAs is used independently, once the energy bandgap is decreased beyond the range of a critical thickness, a problem of mismatching with the Ge substrate will occur. Thus, defect of the material is greatly increased and the efficiency of the solar cell is decreased. In order to solve the aforementioned problems, a GaAsN/GaInAs superlattice structure, GaAsN/GaSbAs superlattice structure, or GaAsN/GaInSbAs superlattice structure is used in the present invention. The lattice is easily matched with the Ge by strain-compensation technology. The material defects are reduced, and the critical thickness is greatly increased, thereby improving the overall efficiency of the solar cell.

The present invention provides a solar cell with a superlattice structure and a fabricating method thereof, which includes adding a proper thickness of GaAsN/GaInAs, GaAsN/GaSbAs, or GaAsN/GaInSbAs superlattice structure in the base-emitter GaAs (1.40 eV) layer of the middle cell element of the triple junction solar cell by strain-compensation technology, so as to enhance the efficiency. In the present invention, GaAsN and GaInAs with energy bandgaps lower than GaAs are mainly used to absorb the long-wavelength region. Then, the superlattice structure is fabricated by use of the strain-compensation effect between the tensile strain generated by GaAsN and the compressive strain generated by GaInAs. Thereby, the lattice can easily match with Ge, thus the material defects are reduced and the critical thickness is greatly increased, so as to enhance overall efficiency. Furthermore, in the range of the critical thickness, the respective N and In contents in the GaAsN and GaInAs can be adjusted properly, such that the energy bandgaps of both are far lower than 1.40eV and the absorption can be extended to the long-wavelength region. As such, absorption of the infrared light region of sunshine is increased, and thus a high efficient solar cell is obtained.

Figure 2:
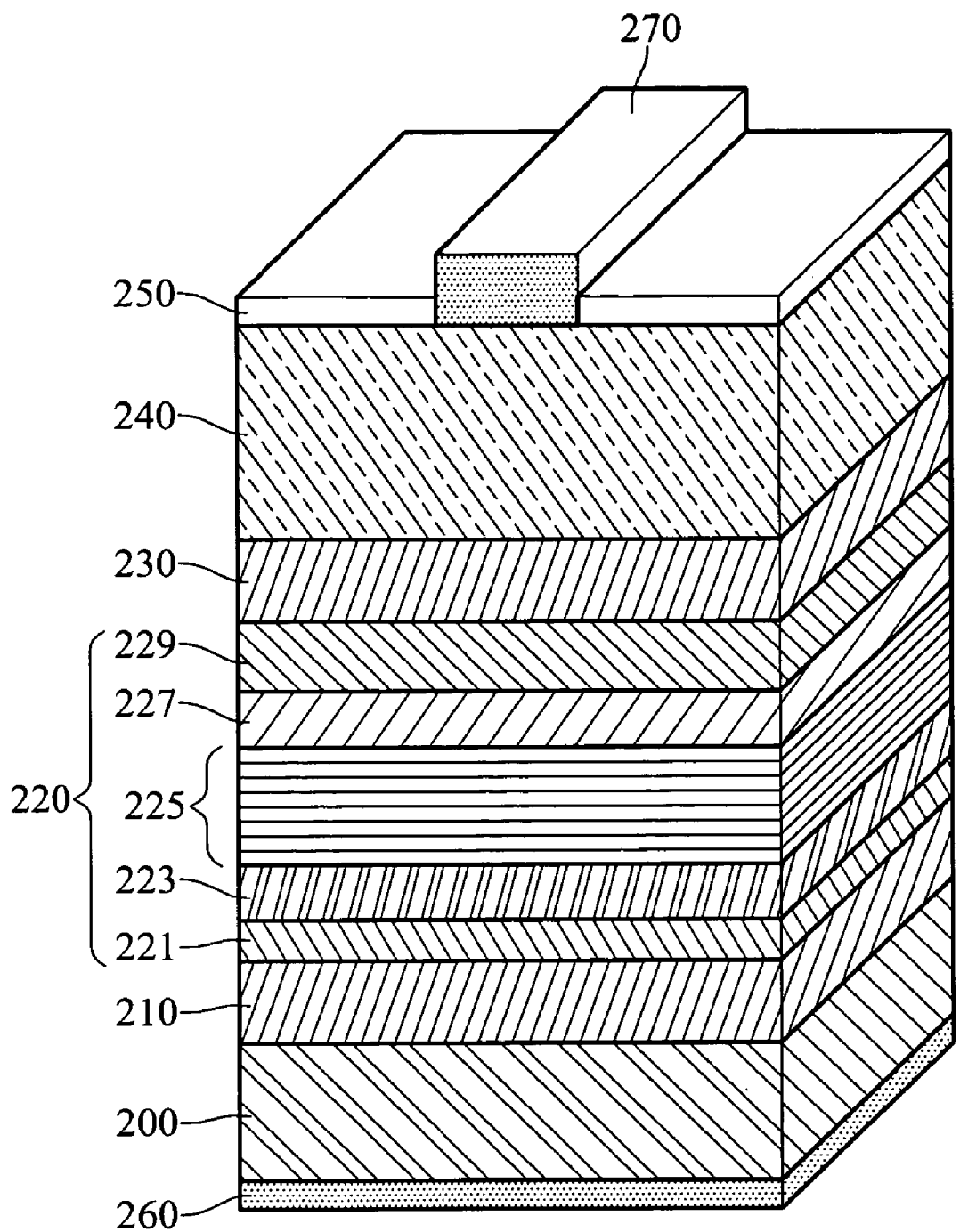
FIG. 2 is a schematic structural view of the method for fabricating a solar cell with a superlattice structure according to an embodiment of the present invention.

FIG. 2 is a schematic structural view of the method for fabricating a solar cell with a superlattice structure according to an embodiment of the present invention. As shown in FIG. 2, the method for fabricating a solar cell with a superlattice structure includes first forming a bottom cell 200 on a provided substrate; then forming a tunnel junction 210 on the bottom cell 200; after that forming a back surface field 221, a base 223, a superlattice structure 225, an emitter 227, and a window 229 on the tunnel junction 210, so as to form a middle cell 220 having the superlattice structure 225; then, forming another tunnel junction 230 on the middle cell 220; forming a top cell 240 on the tunnel junction 230; forming an anti-reflection 250 on the top cell 240; and forming a p/n doped contact 260 on the bottom cell 200 and forming a p/n doped contact 270 with the electrical property opposite that of the contact 260 on the top cell 240.

In the step of forming the bottom cell on the provided substrate, for example, at the beginning of epitaxy, the $AsH_3$ gas is filled to the substrate to form a Ge bottom cell by the diffusion.

The back surface field is, for example, a GaInP, AlGaAs or an AlGaInP back surface field.

The base is, for example, a GaAs or a GaInAs base, and the emitter is, for example, a GaAs or a GaInAs emitter with the electrical property opposite that of the base.

The window is, for example, a GaInP, AlGaAs or an AlGaInP window.

The top cell is, for example, a GaInP, AlGaAs or an AlGaIiP top cell.

In the GaAsN/GaInAs superlattice structure, when the structure is formed by a stack of, for example, $GaAs_{1-x}N_x$ ($0\% < x \leq 5\%$)/$In_xGa_{1-x}As$ ($0\% < x \leq 30\%$), in the middle cell of the triple junction solar cell chip made of the III-V compound semiconductor, a p-i-n structure is used to fabricate the GaAsN/GaInAs superlattice by strain-compensation technology. Material defects may be reduced through the strain-compensation effect, such that the energy bandgaps of the two materials, GaAsN and GaInAs, is pushed forward to reach around 1.0 eV, and the critical thickness is increased to enlarge the absorption region around 1.0 eV and enhance the efficiency of the solar cell.

The solar cell with a superlattice structure and the fabricating method thereof disclosed by the present invention at least comprise the following advantages.

1. In the common triple junction solar cell, the middle cell is mainly made of Ga(In)As, while in the present invention, for example, a GaAsN/GaInAs superlattice structure is added. In the superlattice structure fabricated by strain-compensation technology, the N and In percentage of the GaAsN and GaInAs are respectively adjusted appropriately, so as to efficiently decrease that the mismatching between the lattice constant and the Ge substrate. Though the strain still remains in some partial regions, the GaAsN suffers tensile stress and the GaInAs suffers compressive stress, such that the total strain is zero. Therefore, in the present invention, not only are the defects in the materials reduced, but the growth critical thickness after crystallization is also efficiently increased.

2. Since GaAsN, GaInAs, and GaSbAs all belong to narrower energy bandgap materials as shown in the view of energy bandgap, the absorption region between 1.4 eV and 0.67 eV is increased after GaAsN, GaInAs, and GaSbAs are applied in the structure of the multi-junction solar cell. Therefore, the overall efficiency of the solar cell is enhanced through the present invention.

3. Compared with the conventional material GaInNAs, the GaAsN/GaInAs superlattice structure disclosed by the present invention has preferable quality and advantages, such as high carrier mobility, long diffusion length, low trap density, and high efficiency of spectral response.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solar cell with a superlattice structure, comprising a superlattice structure between a base and an emitter of a middle cell of a triple junction solar cell, the superlattice structure comprising a stack of tensile strain layers that are smaller in lattice constant than the emitter for generating a tensile strain with respect to the emitter, and compressive strain layers that are greater in lattice constant than the emitter for generating a compressive strain with respect to the emitter, wherein the tensile strain generated by the tensile strain layers is compensated by compressive strain generated by the compressive strain layers, thereby reducing material defects and increasing critical thickness.

2. The solar cell with a superlattice structure as claimed in claim 1, wherein the superlattice structure includes a GaAsN/GaInAs superlattice structure, a GaAsN/GaSbAs superlattice structure, or a GaAsN/GaInSbAs superlattice structure.

3. The solar cell with a superlattice structure as claimed in claim 1, wherein the triple junction solar cell includes a GaInP/GaAs/Ge, an AlGaAs/GaAs/Ge, an AlGaInP/GaAs/Ge, a GaInP/GaInAs/Ge, an AlGaAs/GaInAs/Ge, or an AlGaInP/GaInAs/Ge triple junction solar cell.

4. A method for fabricating a solar cell with a superlattice structure, comprising:
providing a substrate;
forming a bottom cell on the substrate;
forming a tunnel junction on the bottom cell;
forming a back surface field, a base, a superlattice structure, an emitter, and a window, so as to form a middle cell having the superlattice structure on the tunnel junction, wherein the superlattice structure comprises a stack of tensile strain layers that are smaller in lattice constant than the base for generating a tensile strain with respect to the base and compressive strain layers that are greater in lattice constant than the base for generating a compressive strain with respect to the base, the tensile strain generated by the tensile strain layers being compensated by compressive strain generated by the compressive strain layers;
forming another tunnel junction on the middle cell;
forming a top cell on the other tunnel junction;
forming an anti-reflection on the top cell; and
forming p/n doped contacts on the bottom cell and the top cell.

5. The method for fabricating a solar cell with a superlattice structure as claimed in claim 4, wherein the superlattice structure includes a GaAsN/GaInAs superlattice structure, a GaAsN/GaSbAs superlattice structure, or a GaAsN/GaInSbAs superlattice structure.

6. The method for fabricating a solar cell with a superlattice structure as claimed in claim 4, wherein the process for forming the superlattice structure includes a strain-compensation technology.

7. The method for fabricating a solar cell with a superlattice structure as claimed in claim 4, wherein the bottom cell includes a Ge bottom cell.

8. The method for fabricating a solar cell with a superlattice structure as claimed in claim 4, wherein the back surface field includes a GaInP back surface field.

9. The method for fabricating a solar cell with a superlattice structure as claimed in claim 4, wherein the back surface field includes an AlGaAs back surface field.

10. The method for fabricating a solar cell with a superlattice structure as claimed in claim 4, wherein the back surface field includes an AlGaInP back surface field.

11. The method for fabricating a solar cell with a superlattice structure as claimed in claim 4, wherein the base includes a GaAs base.

12. The method for fabricating a solar cell with a superlattice structure as claimed in claim 4, wherein the base includes a GaInAs base.

13. The method for fabricating a solar cell with a superlattice structure as claimed in claim 4, wherein the emitter includes a GaAs emitter.

14. The method for fabricating a solar cell with a superlattice structure as claimed in claim 4, wherein the emitter includes a GaInAs emitter.

15. The method for fabricating a solar cell with a superlattice structure as claimed in claim 4, wherein the window includes a GaInP window.

16. The method for fabricating a solar cell with a superlattice structure as claimed in claim 4, wherein the window includes an AlGaAs window.

17. The method for fabricating a solar cell with a superlattice structure as claimed in claim 4, wherein the window includes an AlGaInP window.

18. The method for fabricating a solar cell with a superlattice structure as claimed in claim 4, wherein the top cell includes a GaInP top cell.

19. The method for fabricating a solar cell with a superlattice structure as claimed in claim 4, wherein the top cell includes an AlGaAs top cell.

20. The method for fabricating a solar cell with a superlattice structure as claimed in claim 4, wherein the top cell includes an AlGaInP top cell.

21. The solar cell with a superlattice structure as claimed in claim 1, wherein the material of the tensile strain layer is one or any alloy combination of GaAsN, GaAl and AlP.

22. The solar cell with a superlattice structure as claimed in claim 1, wherein the material of the compressive strain layer is one or any alloy combination of GaInAs, Ge, InP, InAs, GaSb, AlSb, InSb, AlSb and GaSbAs.

* * * * *